US006157228A

United States Patent [19]

Yokoyama et al.

[11] Patent Number: 6,157,228

[45] Date of Patent: Dec. 5, 2000

[54] DATA LINE DRIVING CIRCUIT FORMED BY A TFT BASED ON POLYCRYSTALLINE SILICON

[75] Inventors: Ryoichi Yokoyama, Ohgaki; Masayuki Koga, Anpachi-Gun, both of Japan

[73] Assignee: Sanyo Electric, Co., Ltd., Osaka, Japan

[21] Appl. No.: 09/150,960

[22] Filed: Sep. 10, 1998

[30] Foreign Application Priority Data

Sep. 12, 1997 [JP] Japan .................................. 9-248753

[51] Int. Cl.[7] .......................................... H03L 7/00

[52] U.S. Cl. .......................... 327/144; 327/162; 345/213

[58] Field of Search ................................ 327/141, 144, 327/153, 162, 163; 345/205, 208, 213, 98, 100

[56] References Cited

U.S. PATENT DOCUMENTS 5,617,111 4/1997 Saitoh .................................. 345/100
5,648,792 7/1997 Sato et al. .............................. 345/92
5,754,155 5/1998 Kubota et al. .......................... 345/98
5,903,234 5/1999 Kimura .................................. 341/144

OTHER PUBLICATIONS

ASADA, et al., "A Poly–Si Defect–Tolerant Scanner for Large Area AMLCDs," 1996 IEEE International Solid–State Circuits Conference, pp. 198–199.

*Primary Examiner*—Jung Ho Kim
*Attorney, Agent, or Firm*—Hogan & Hartson, LLP

[57] ABSTRACT

A data line driving circuit comprises a shift register for sequentially generating sampling pulses according to a clock pulse, a buffer connected to each stage of the shift register, and a sampling switch for sampling a data signal according to the sampling pulse outputted from the buffer. The buffer is provided with a logic gate for synchronizing the output of the shift register with the clock signal.

6 Claims, 8 Drawing Sheets

DATA LINE DRIVING CIRCUIT FORMED BY A TFT BASED ON POLYCRYSTALLINE SILICON

BACKGROUND OF THE INVENTION

1. Field of the Invention

The present invention generally relates to a driving circuit built in an active matrix panel and, more particularly, to a data line driving circuit formed by a thin-film transistor (hereafter referred to as a TFT) based on polycrystalline silicon.

2. Description of Related Art

In an active matrix panel with TFTs made of polycrystalline silicon, a TFT is provided for each picture element electrode arranged in a matrix and data lines intersect scan lines at right angles. A data line driving circuit and a scan line driving circuit for respectively driving each of the data lines or each of the scan lines are built into the active matrix panel.

A known data line driving circuit is shown in FIG. 5. In FIG. 5, reference numeral 1 denotes a picture element section, in which a plurality of scan lines 11, 12, and so on and a plurality of data lines 21, 22, and so on are arranged in an orthogonal manner. TFTs 31, 32, etc. are formed near where the scan lines and the data lines intersect. The gate electrode of each TFT is connected to a corresponding scan line and the drain electrode of the TFT is connected to a corresponding data line. The source electrodes of the TFTs 31, 32, etc. are connected to respective picture element electrodes 41, 42, etc. arranged in a matrix. A liquid crystal (LC) is sandwiched between each of the picture element electrodes and its opposing electrode COM. Reference numerals 51, 52, etc. denote storage capacitors. Referring to FIG. 5, each of the picture element electrodes 41, 42, etc. is represented in the upper line of each LC. The opposing electrode COM is a common electrode and is represented by a terminal for convenience of description.

Each of the scan lines 11, 12, etc. is supplied with a scan line signal from a corresponding scan line driving circuit, not shown. The data lines 21, 22, etc. are inserted with respective sampling switches 61, 62, etc. which sample video data signals, and supply the sampled video signals to the data lines. Reference numeral 8 denotes a shift register for generating a sampling pulse for switching on the sampling switches 61, 62, etc. The outputs of the stages constituting the shift register 8 are sent to respective buffers 71, 72, etc. each comprising a plurality of inverters. The sampling pulses output from these buffers are input into the respective sampling switches 61, 62, etc.

The shift register 8 includes a latch circuit 81 that operates at a rising edge of a clock signal CLK and a latch circuit 82 that operates at a falling edge of the clock signal CLK, these latch circuits being alternately connected with each other. The input terminal of the first-stage latch circuit 81 is applied with a start signal STH that goes logic high level (hereafter referred to as HIGH) for about one period of the clock signal CLK. The clock signal CLK determines the timing in which data is written to the LC of each picture element and is in synchronization with a dot clock.

In more detail, the latch circuit 81 is composed of a clocked inverter 811 to which an input signal is applied, an inverter 812 to which output of the clocked driver 811 is applied, and a clocked inverter 813 arranged between the output and input of the inverter 812. The clocked inverter 813 is arranged in the direction inverse to the inverter 812. The clocked inverter 811 is on when the clock signal CLK is HIGH. The clocked inverter 813 is on when the clock signal CLK is at logic low level (hereafter referred to as LOW). The latch circuit 82 is generally of the same in constitution as the latch circuit 81, but the clocked inverter 821 is on when the clock signal CLK is LOW and the clocked inverter 823 is on when the clock signal CLK is HIGH. Thus, in the latch circuit 82, the timing in which the clocked inverters go on is reverse to that of the latch circuit 81. The shift register 8, the buffers 71, 72, etc. and the sampling switches 61, 62, etc. together constitute a data line driving circuit 9.

FIG. 6 shows a timing chart indicative of operations of the above-mentioned related-art data line driving circuit. When a start signal STH is input in the above-described known circuit, a sampling pulse A1, which is the output of the first-stage latch circuit 81 of the shift register 8 rises, with a slight delay, along with the rising of the clock signal CLK, and goes HIGH for one period of the clock signal CLK. Next, the sampling pulse A1 passes the buffer 71 to be delayed further, becoming a sampling pulse B1, which goes HIGH for one period of the clock signal CLK. Then, the delayed sampling pulse B1 is applied to the gate of the TFT constituting the sampling switch 61. While the sampling pulse B1 is HIGH, a video signal is supplied to the data line 21. Likewise, after the next falling of the clock pulse CLK, a sampling pulse A2 is output with a delay from the next-stage latch circuit 82 of the shift register 8. The sampling pulse A2 passes the buffer 72 to be further delayed, causing a sampling pulse B2 to go HIGH. The sampling pulse B2 supplies the video signal to the data line 22 through the sampling switch 62.

In the above-described constitution, each sampling switch is constituted by one TFT. An analog sampling switch comprised of two TFTs is also used often, an example of which is illustrated in FIG. 7. Referring to FIG. 7, each sampling switch 91, 92, etc. comprises an analog switch based on a p-channel TFT and an n-channel TFT. Buffers 101, 102, etc. differ in constitution from the buffers 71, 72, etc. shown in FIG. 5. A data line driving circuit 9 comprises a shift register 8, the buffers 101, 102, etc., and the sampling switches 91, 92, etc.

In the constitution of FIG. 7, signals having opposite polarities must be applied to the gate electrodes of the two TFTs, which inevitably increases the number of inverters for each buffer and more inverters for matching the two TFTs in on and off timing. Therefore, as shown in FIG. 8, these inverters considerably delay the signals within the buffers 101, 102, etc. These delayed sampling pulses B1 and C1, B2 and C2, etc. turn on/off the respective sampling switches 91, 92, etc.

In the known art shown in FIGS. 5 and 7, many inverters in the buffers considerably delay the sampling pulses to be output from the shift register. In addition, the shift register itself has many inverters, further increasing the delay. The cumulative delay disables the turning on/off of the sampling switches with the originally intended timing for writing a video signal to liquid crystal picture elements. This result in a nonuniformity of display and degrades display quality. Large variations in TFT characteristics lead to an accompanying large variation in the delay amount and further degrade display quality.

In addition, in the examples, the HIGH level periods of sampling pulses partially overlap each other between adjacent picture elements. In the overlapped portion, the adjacent sampling switches turn on together. Consequently, in this overlapped portion, two or more data lines are connected to the video signal line, increasing the resistance and parasitic capacity of the video signal line, thereby making the video signal less sharp. This also adds to the degradation of display quality.

SUMMARY OF THE INVENTION

It is therefore an object of the present invention to provide a data line driving circuit for optimizing the timing for driving a thin-film transistor connected to each picture element electrode. In carrying out the invention and according to one aspect thereof, each buffer has a logic gate for synchronizing a first sampling pulse supplied from each of latch circuits with a clock signal. Consequently, the novel constitution can synchronize the timing of driving each thin-film transistor with the clock signal, thereby minimizing the deviation in sampling timing. At the same time, the novel constitution reduces the number of sampling switches that turn on simultaneously, thereby eliminating nonuniformity in display to enhance display quality.

BRIEF DESCRIPTION OF THE DRAWINGS

These and other objects of the invention will be explained in the description below, in connection with the accompanying drawings, in which.

DETAILED DESCRIPTION OF THE PREFERRED EMBODIMENT

A preferred embodiment of the present invention will be described in further detail with reference to the accompanying drawings.

Figure 1:
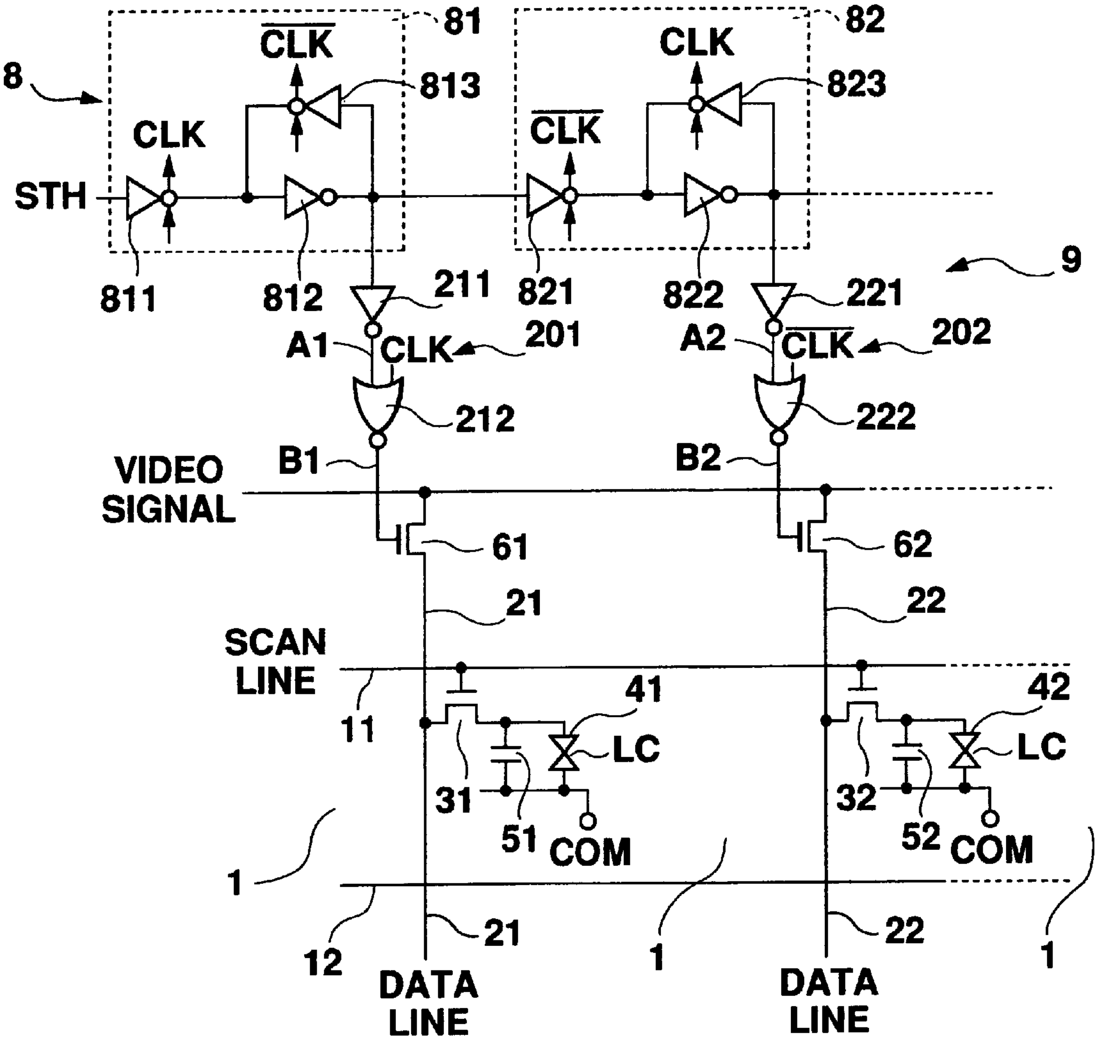
FIG. 1 is a circuit diagram illustrating a data line driving circuit according to a first embodiment of the invention.
Figure 5:
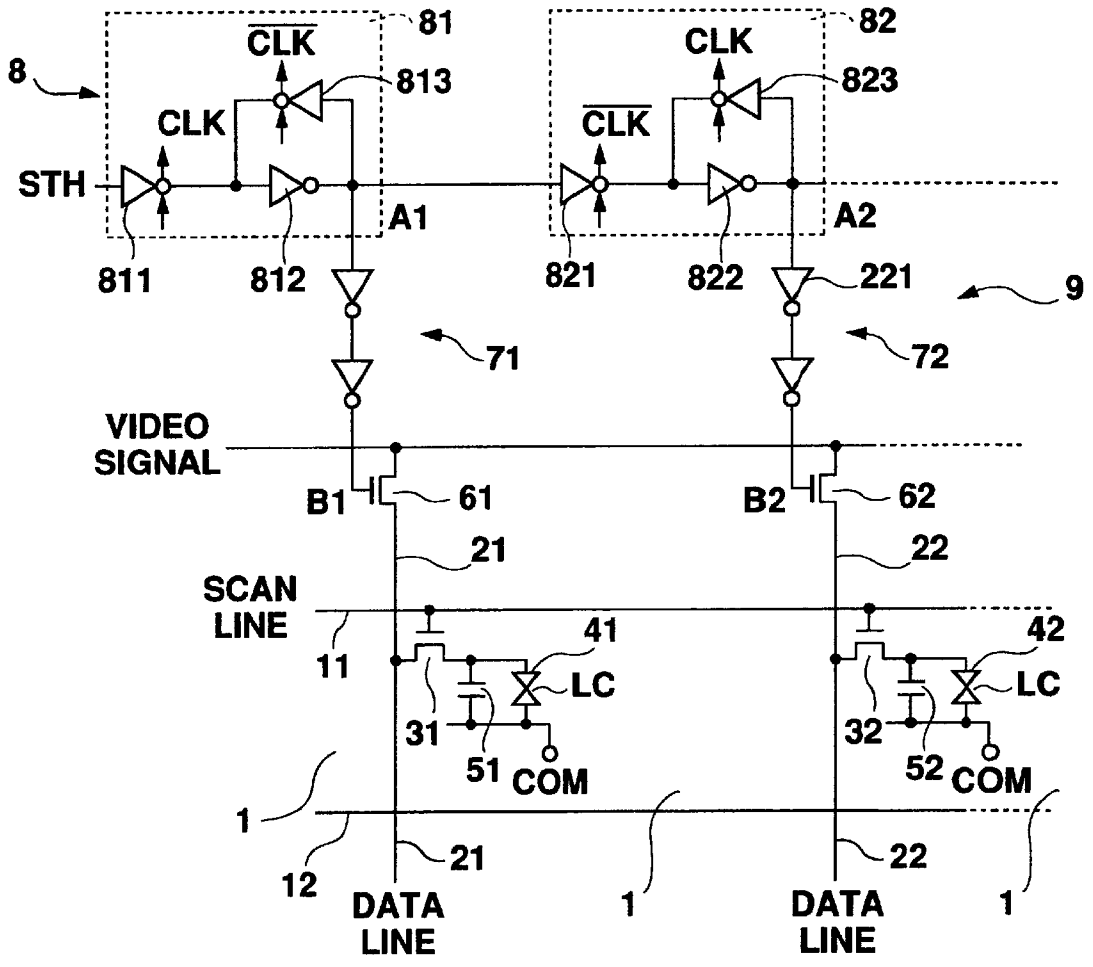
Fig. 5 PRIOR ART
FIG. 5 is a circuit diagram for a prior art.
Figure 6:
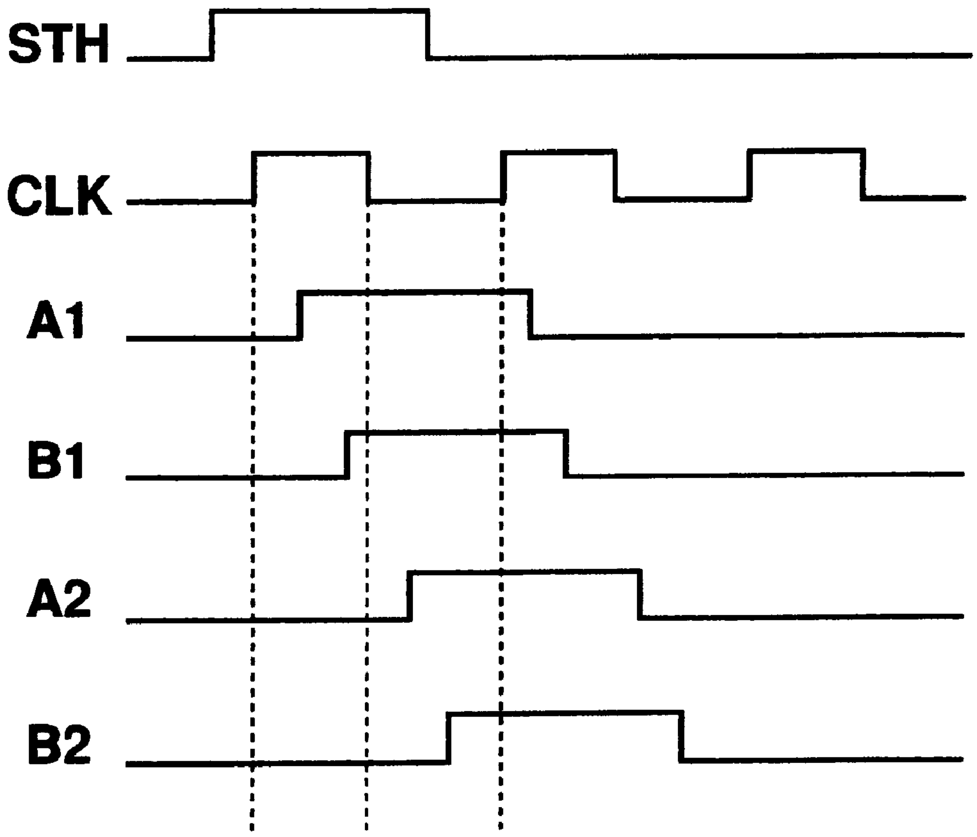
Fig. 6 PRIOR ART
FIG. 6 is a timing chart illustrating the operations of the example art of FIG. 5.

Referring to FIG. 1, sampling switches 61 and 62 each comprises one TFT (Thin-Film Transistor), as was the case with the related example shown in FIG. 5. The circuit constitution of FIG. 1 differs from that of FIG. 5 only in buffer constitution, the rest corresponding to that of circuit of FIG. 5. A data line driving circuit 9 is built in an active matrix panel formed with a picture element section 1. All the TFTs used in the data line driving circuit 9 and the picture element section 1 are made of polycrystalline silicon.

A first-stage buffer 201 comprises an inverter 211 to which an output of a first-stage latch circuit 81 of a shift register 8 is input and a NOR gate 212 to which an output A1 of the inverter 211 and a clock signal CLK are input. Output of the NOR gate 212 is applied to the gate electrode of the TFT of the sampling switch 61. On the other hand, a next-stage buffer 202 comprises an inverter 221 to which an output of a next-stage latch circuit 82 of the shift register 8 is input and a NOR gate 222 to which an output A2 of the inverter 221 and a reverse signal of the clock signal CLK are input. An output of the NOR gate 222 is applied to the gate electrode of the TFT of the sampling switch 62. In third and subsequent stages, buffers having the same constitutions as those of the buffer 201 and the buffer 202 are connected with each other alternately.

Figure 2:
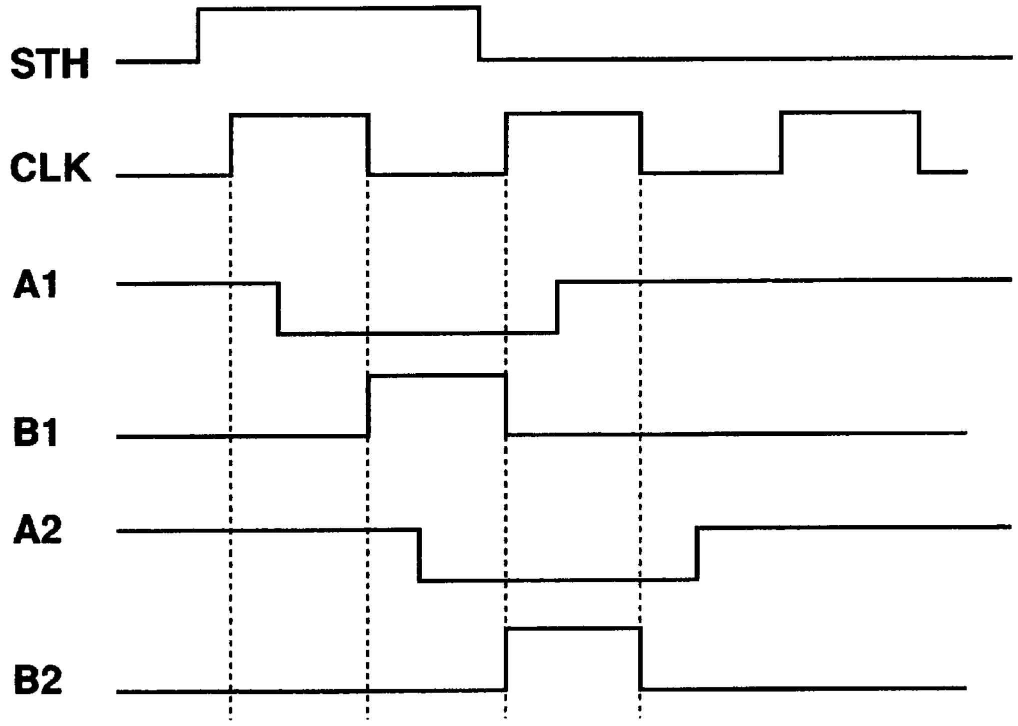
FIG. 2 is a timing chart illustrating the operations of the first embodiment.

When a start signal STH is input to this circuit as shown in FIG. 2, an output of the first stage of the shift register 8 rises, with a slight delay, after the rising of the clock signal CLK, further delaying the output A1 of the inverter 211 in the buffer 201. However, the output A1 of the inverter 211 and the clock signal CLK are input in the next-stage NOR gate 212. Therefore, a sampling pulse B1, which is the output of the NOR gate 212, goes HIGH only when the output A1 of the inverter 211 and the clock signal CLK are both LOW. Namely, the NOR gate 212 can synchronize the output A1 of the inverter 211 with the clock signal CLK. The sampling pulse B1 goes HIGH only when the clock signal CLK is LOW (for a one-half period of the clock signal). Thus, the sampling switch 61 goes on only when the sampling pulse B1 is HIGH and then supplies the video signal to data line 21.

Even when the sampling timing is delayed by the shift register 8 and the inverter 211 in the buffer 201, the delayed timing is corrected by the NOR gate 212 to the original timing to thereby correctly write data to the corresponding liquid crystal picture element and thereby prevent display nonuniformity. On the other hand, the NOR gate 222 in the buffer 202 also synchronizes the next-stage an output of the shift register 8 with the clock signal CLK, causing the sampling pulse B2 to go HIGH only when the output A2 of the inverter 221 and the inverted signal of the clock signal CLK are both LOW.

Figure 3:
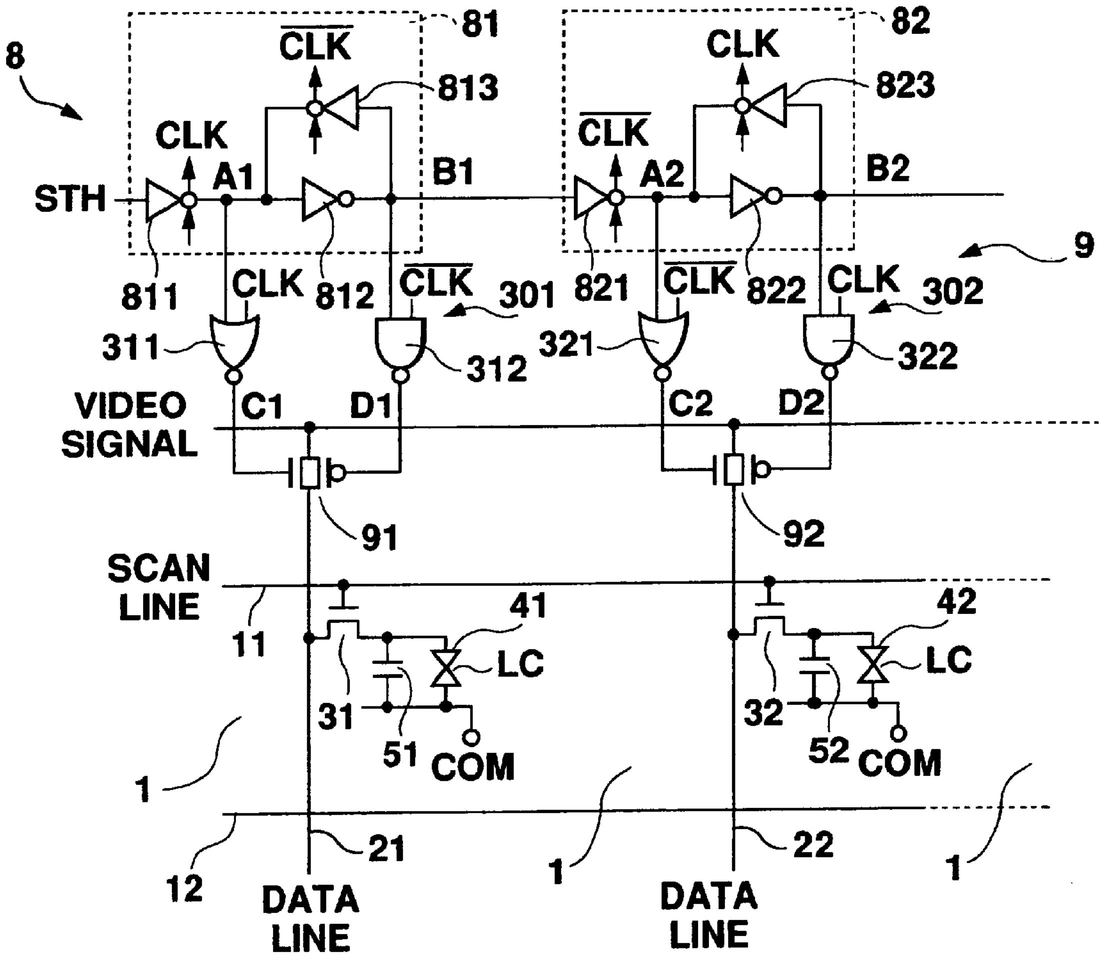
FIG. 3 is a circuit diagram illustrating a data line driving circuit practiced as a second embodiment of the invention.
Figure 7:
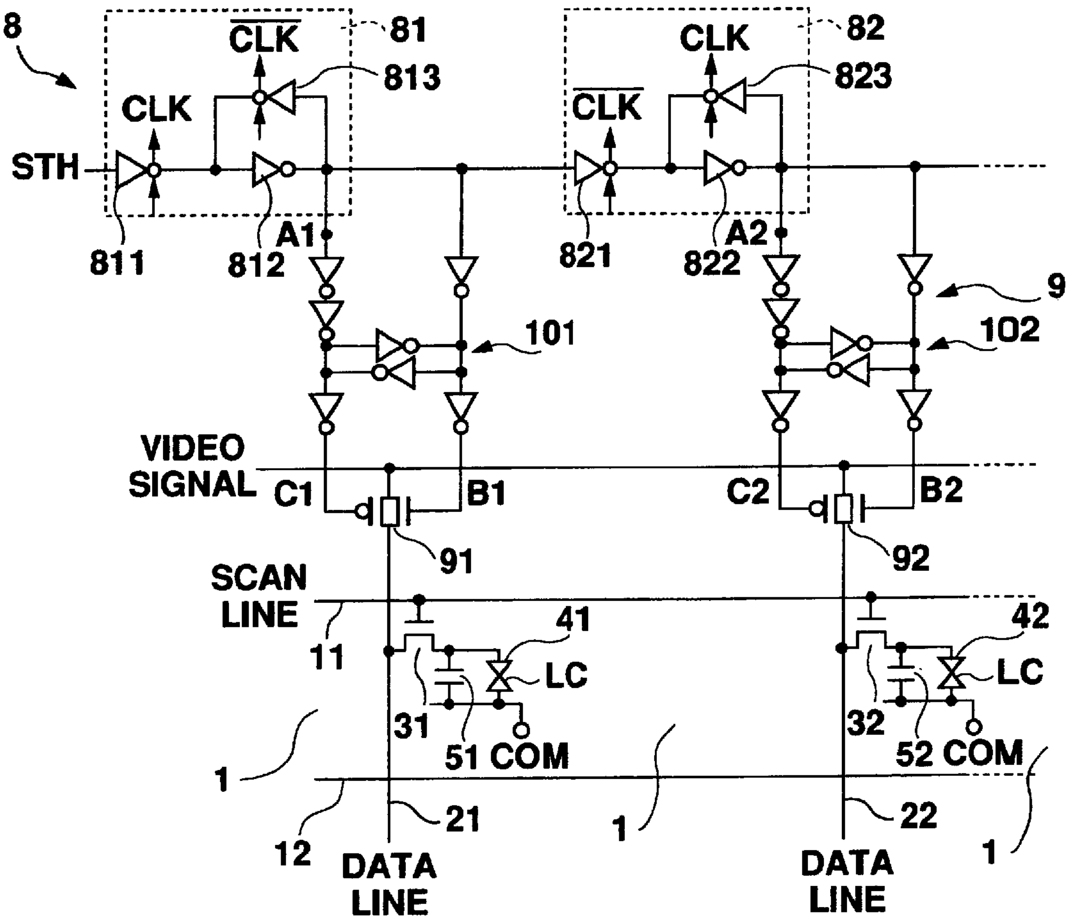
Fig. 7 PRIOR ART
FIG. 7 is a circuit diagram for a second prior art.
Figure 8:
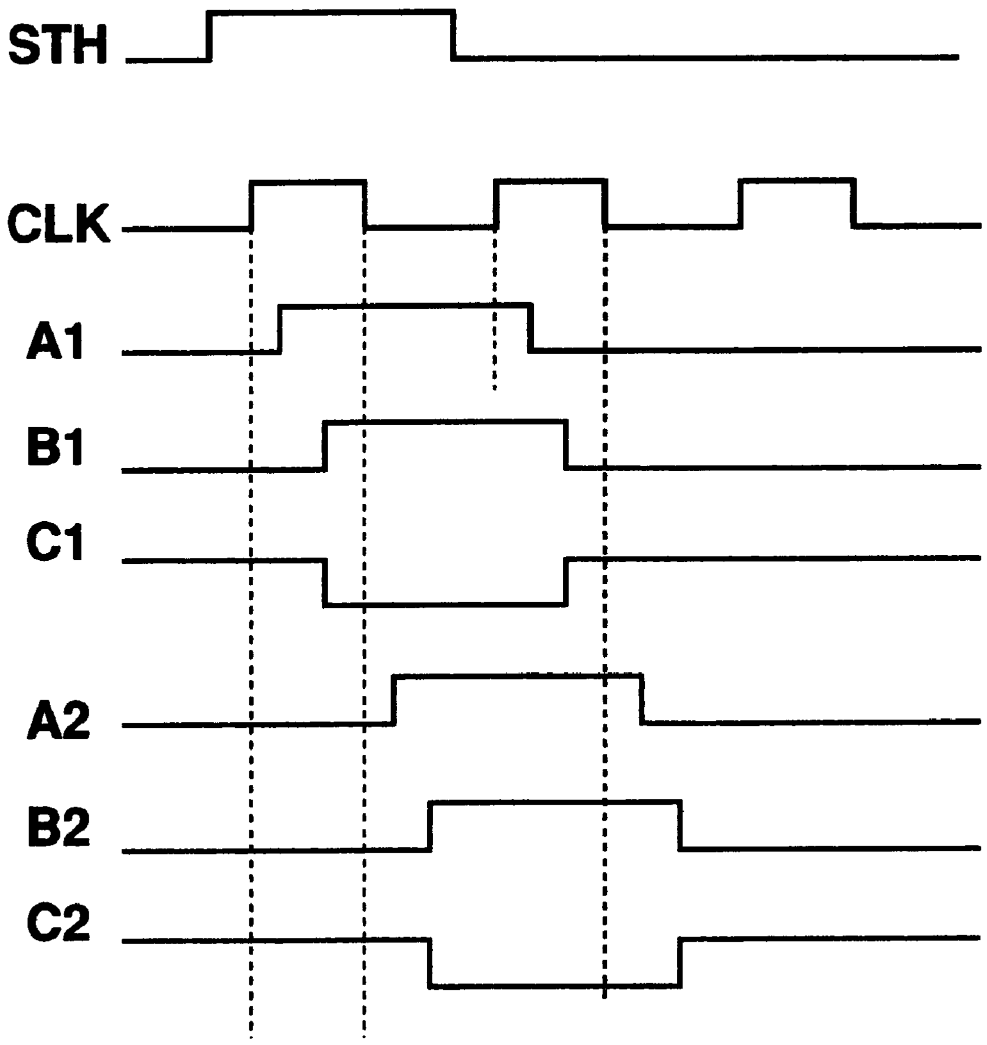
FIG. 8 is a timing chart illustrating the operations of the example of FIG. 7.

In the constitution of FIG. 1, the periods in which the sampling switches turn on are independent of each other and therefore, as shown in FIG. 2, do not overlap each other, thereby reducing the load connected to the video signal line and, at the same time, preventing the video signal from becoming less sharp. FIG. 3 is a circuit diagram illustrating a second preferred embodiment of the invention. As shown, similar to the known art, each of sampling switches 91 and 92 comprises an analog switch composed of two TFTs. The constitution of FIG. 3 differs from the that of FIG. 7 in buffer constitution (buffers 301, 302, etc.). A data line driving circuit 9 is built in an active matrix panel formed with a picture element section 1. Each TFT contained in the data line driving circuit 9 and the picture element section 1 is made of polycrystalline silicon.

A first-stage buffer 301 comprises a NOR gate 311, to which an output A1 of a clocked inverter 811 in a first-stage latch circuit 81 of a shift register 8 and a clock signal CLK are input and a NAND gate 312 to which a first-stage output B1 of the shift register 8 and an inverted signal of the clock signal CLK are input. An output C1 of the NOR gate 311 is applied to the gate electrode of an n-channel TFT constituting the sampling switch 91, and an output D1 of the NAND gate 312 is applied to the gate electrode of a p-channel TFT constituting the sampling switch 91.

A next-stage buffer 302 comprises a NOR gate 321 in which an output A2 of a clocked inverter 821 in a next-stage latch circuit 82 of the shift register 8 and an inverted signal of the clock signal CLK are input and a NAND gate 322 in which a next-stage output B2 of the shift register 8 and the clock signal CLK are input. An output C2 of the NOR gate 321 is applied to the gate electrode of an n-channel TFT constituting the sampling switch 92, while an output D2 of the NAND gate 322 is applied to the gate electrode of a p-channel TFT constituting the sampling switch 92. In third and subsequent stages, buffers having the same constitutions as those of the buffer 301 and the buffer 302 respectively are connected with each other alternately.

Figure 4:
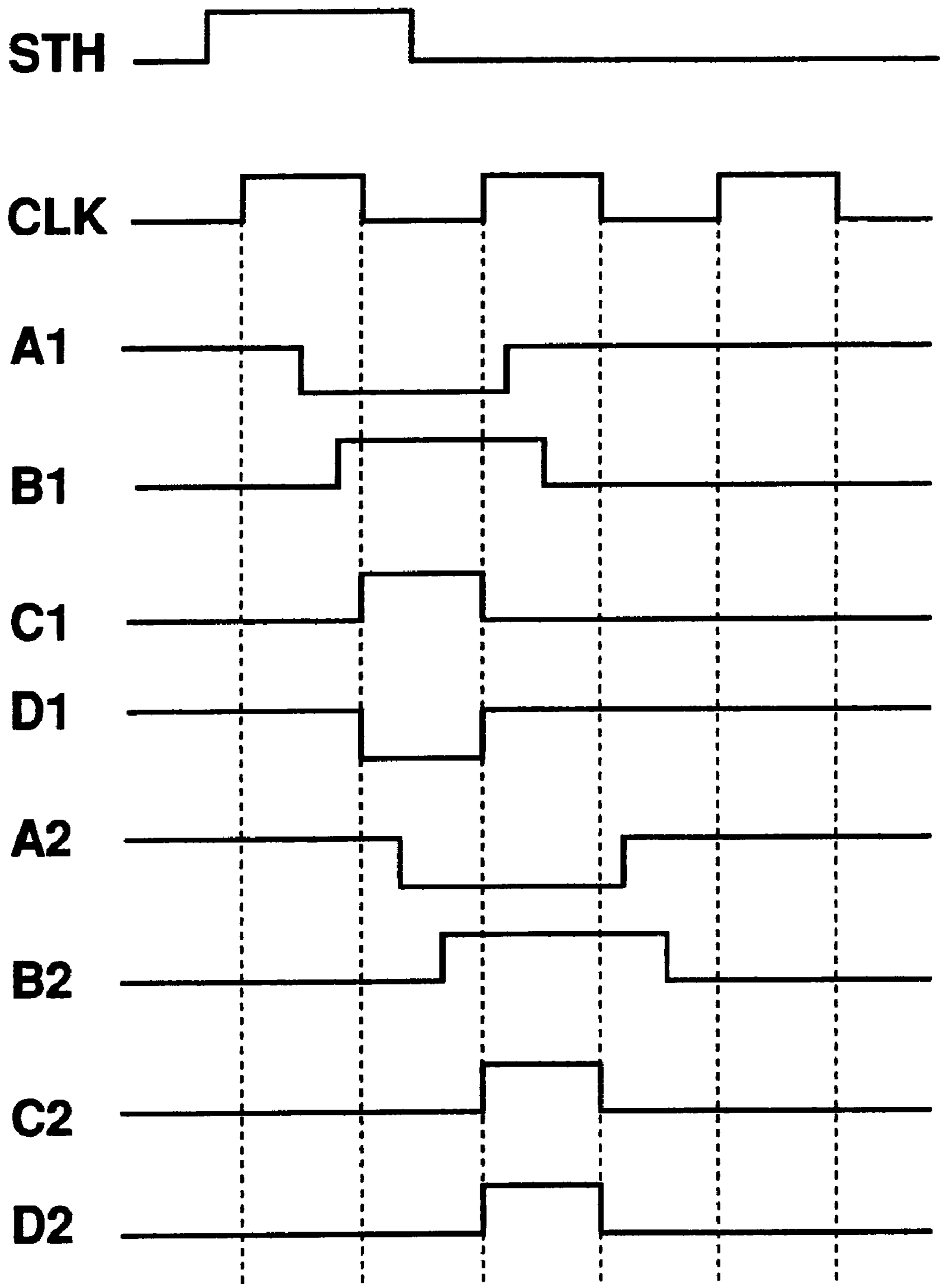
FIG. 4 is a timing chart illustrating the operations of the second embodiment.

When a start signal STH is input in this circuit as shown in FIG. 4, the first-stage output A1 of the shift register 8 falls after the rising of the clock signal CLK with a slight delay, further delaying the output B1. However, the output A1 and the clock signal CLK are input to the NOR gate 311, while the output B1 and the inverted signal of the clock signal CLK are input in the NAND gate 312. Therefore, the sampling pulse C1 goes HIGH only when the output A1 and the clock signal CLK are both LOW, and the sampling pulse D1 goes LOW only when the output B1 and the inverted signal of the clock signal CLK are both HIGH.

Namely, the NOR gate 311 and the NAND gate 312 can synchronize the first-stage outputs A1 and B1 of the shift register 8 with the clock signal CLK. The sampling switch 91 turns on only when the sampling pulse C1 is HIGH and the sampling pulse D1 is LOW, thereby supplying a video signal to a data line 21. In other words, even if the sampling timing is delayed by the inverters in the shift register 8, the delayed timing is corrected by the NOR gate 311 and the NAND gate 312 to the original timing to correctly write data to a corresponding liquid crystal picture element, thereby preventing display nonuniformity.

In addition, the NOR gate 321 and the NAND gate 322 in the buffer 302 synchronize the next-stage outputs A2 and B2 of the shift register 8 with the clock signal CLK. Therefore, as shown in FIG. 4, the sampling pulse B2 goes HIGH only when the output A2 and the inverted signal of the clock signal CLK are both LOW and the sampling pulse D2 goes HIGH only when the output B2 and the clock signal CLK are both HIGH.

In the constitution shown in FIG. 3, the periods in which the sampling switches are on are independent of each other and therefore do not overlap each other, thereby reducing the load to be connected to the video signal line and, at the same time, preventing the video signal from becoming less sharp. It should be noted that, in order to obtain a drive current for turning on/off the sampling switches, inverters may be added as required before and after the NOR gate and the NAND gate in the buffer shown in FIGS. 1 and 3.

For simplification of description of the preferred embodiment, only sample signal states were described. It should be obvious to those skilled in the art that HIGH level and LOW level may be easily inverted as appropriate to constitute equivalent circuits. For example, the HIGH and LOW levels of the signal STH and the clock signal CLK may be inverted beforehand to use a NAND gate instead of the NOR gate. Also, transistors having polarities opposite to those of the transistors used in the embodiments may be used.

While the preferred embodiment of the present invention has been described using specific terms, such description is for illustrative purposes only, and it is to be understood that changes and variations may be made without departing from the spirit or scope of the appended claims.

What is claimed is:

1. A data line driving circuit for supplying through a data line a data signal to a thin-film transistor connected to a picture element electrode, comprising:

a shift register having a plurality of latch circuits for generating a plurality of pulses having different timings each as a first sampling pulse according to a clock signal;

a plurality of buffers each connected to one of said plurality of latch circuits to generate a second sampling pulse according to first sampling pulse input to said plurality of buffers; and a plurality of sampling switches each including an analog switch for sampling said data signal coming from said data line according to said second sampling pulse output from said plurality of buffers;

wherein each of said plurality of buffers has a logic gate to synchronize said first sampling pulse supplied from each of said plurality of latch circuits with said clock signal.

2. The data line driving circuit as claimed in claim 1, wherein a start pulse with a period longer than one-half that of said clock pulse and shorter than one full clock pulse period is input to said shift register and said plurality of latch circuits each sequentially outputs said first sampling pulse having a period corresponding to the period of said clock pulse.

3. The data line driving circuit as claimed in claim 2, wherein said clock signal and an output of one of said plurality of latch circuits are input to said logic gate, from which said second sampling pulse that goes to either high or low logic level is output when said clock signal is at either high or low logic level, and said output of one of said plurality of latch circuits is at either high or low level.

4. The data line driving circuit as claimed in claim 3, wherein said logic gate is a NOR gate that outputs said second sampling pulse that goes to logic high level for one-half of the period of said clock pulse when said clock signal and said output of said plurality of latch circuits to be input in said NOR gate are both at logic low level.

5. The data line driving circuit as claimed in claim 1, wherein:

said plurality of sampling switches each have an analog switch containing one p-channel thin-film transistor and one n-channel thin-film transistor;

said logic gate comprises two logic gates for synchronizing the output of each of said plurality of latch circuits and an inverted signal of said output with said clock signal; and said analog switch operates according to a pair of second sampling pulses, which is an output of said two logic gates.

6. The data line driving circuit as claimed in claim 5, wherein:

one of said two logic gates is a first logic gate, to which said clock signal and said output of each of said plurality of latch circuits are input to cause the output of one of said pair of second sampling pulses that goes to either logic high or low level when said clock signal is at either logic high or low level and said output of each of said plurality of latch circuits is at logic high or low level; and the other of said two logic gates is a second logic gate, to which an inverted signal of said clock signal and an inverted output of said shift register are input to cause the output of the other of said pair of second sampling pulses that goes to either logic low or high level when said clock signal is at either logic high or low level and an inverted output of said plurality of latch circuits is at either logic low or high level.

* * * * *